(12) United States Patent
Chen

(10) Patent No.: US 6,430,056 B1
(45) Date of Patent: Aug. 6, 2002

(54) SIMPLE SCREWFREE LOCKING STRUCTURE FOR COMPUTER INTERFACE CARD AND SHIELD PLATE OF INTERFACE CARD SOCKET

(75) Inventor: Feng-Ming Chen, Chung Ho (TW)

(73) Assignee: Chenbro Micom Co., Ltd., Taipei Hsien (TW)

( * ) Notice: Subject to any disclaimer, the term of this patent is extended or adjusted under 35 U.S.C. 154(b) by 8 days.

(21) Appl. No.: 09/916,261

(22) Filed: Jul. 30, 2001

(30) Foreign Application Priority Data

May 22, 2001 (TW) ........................................ 90208332 U

(51) Int. Cl.$^7$ ................................................ H05K 7/12
(52) U.S. Cl. ........................... 361/759; 361/801; 70/58; 248/73; 211/41.17
(58) Field of Search ................................. 361/683, 686, 361/730, 732, 753, 759, 797, 801, 802; 211/41.17; 312/223.1, 265.1, 265.5; 70/58; 248/73

(56) References Cited

U.S. PATENT DOCUMENTS 5,317,483 A * 5/1994 Swindler .................... 361/752
5,575,546 A * 11/1996 Radloff ...................... 174/35 R
5,601,349 A * 2/1997 Holt ............................ 174/67
5,757,618 A * 5/1998 Lee ............................. 361/686
5,982,627 A * 11/1999 Haughton et al. .......... 361/759
6,215,668 B1 * 4/2001 Hass et al. ..................... 24/553
6,320,752 B1 * 11/2001 Jang ........................... 361/740
6,320,760 B1 * 11/2001 Flamm et al. ............ 211/41.17

* cited by examiner

Primary Examiner—Jayprakash N. Gandhi
(74) Attorney, Agent, or Firm—Rosenberg, Klein & Lee

(57) ABSTRACT

Simple screwfree locating structure for computer interface card and shield plate of interface card socket, including: a base board fixedly mounted on a computer housing corresponding to the computer interface card socket, the base board being formed with at least one slide tunnel; at least one slide rod correspondingly slidably disposed in the slide tunnel of the base board; and at least one latch board correspondingly connected with bottom end of the slide rod. A locating pin downward projects from the bottom of the latch board. When the slide rod is slided toward the interface card socket, the locating pin of the latch board is driven and correspondingly inserted and latched in a fixing hole of an insertion plate and a retaining board of top end of the interface card socket. Accordingly, the insertion plate can be tightly fixed on inner side of the interface card socket.

4 Claims, 4 Drawing Sheets

SIMPLE SCREWFREE LOCKING STRUCTURE FOR COMPUTER INTERFACE CARD AND SHIELD PLATE OF INTERFACE CARD SOCKET

BACKGROUND OF THE INVENTION

The present invention is related to a simple screwfree locating structure for computer interface card and shield plate of interface card socket. When a slide rod is slided, a latch board is driven to tightly fix an interface card or a shield plate on inner side of the interface card socket of the computer housing.

For expanding the function of a personal computer or servo generally will include an interface card socket section having multiple interface card sockets in which audio card, communication card, display card, etc. are inserted. After the interface card is inserted into the interface card socket, the interface card is tightly locked on inner side of the interface card socket by a screw. With respect to the interface card socket free from interface card, in order to avoid interference of external electromagnetic wave, a shield plate is generally locked on inner side of the interface card socket. A personal computer includes multiple interface card sockets. Therefore, when assembled, an assembler must use a screwdriver and screws to one by one lock the interface cards or shield plates on inner sides of the interface card sockets. Such procedure is quite troublesome and time-consuming. When detaching the interface cards or shield plates from the interface card sockets, it is also necessary to use the screwdriver to unscrew the screws one by one.

SUMMARY OF THE INVENTION

It is therefore a primary object of the present invention to provide a simple screwfree locating structure for computer interface card and shield plate of interface card socket, including: a base board fixedly mounted on a computer housing above the computer interface card socket, the base board being formed with at least one slide tunnel; at least one slide rod correspondingly slidably disposed in the slide tunnel of the base board; and at least one latch board correspondingly connected with bottom end of the slide rod, a locating pin downward projecting from the bottom of the latch board. When the slide rod is slided toward the interface card socket, the locating pin of the latch board is driven and correspondingly inserted and latched in a fixing hole of an insertion plate and a retaining board of top end of the interface card socket so as to tightly fix the insertion plate on inner side of the interface card socket.

The present invention can be best understood through the following description and accompanying drawings wherein:

DETAILED DESCRIPTION OF THE PREFERRED EMBODIMENT

Figure 1:
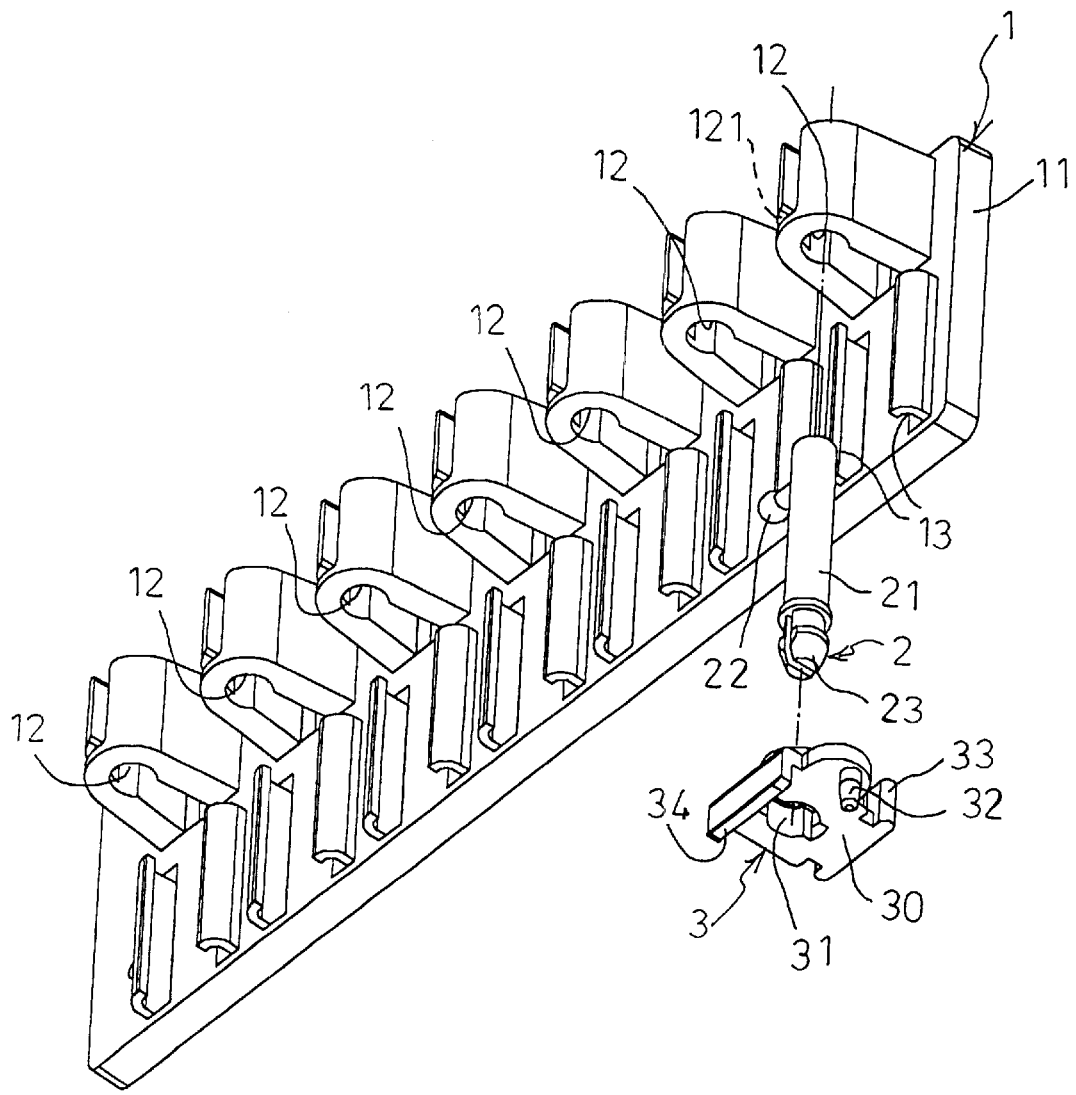
FIG. 1 is a perspective exploded view of the present invention.
Figure 2:
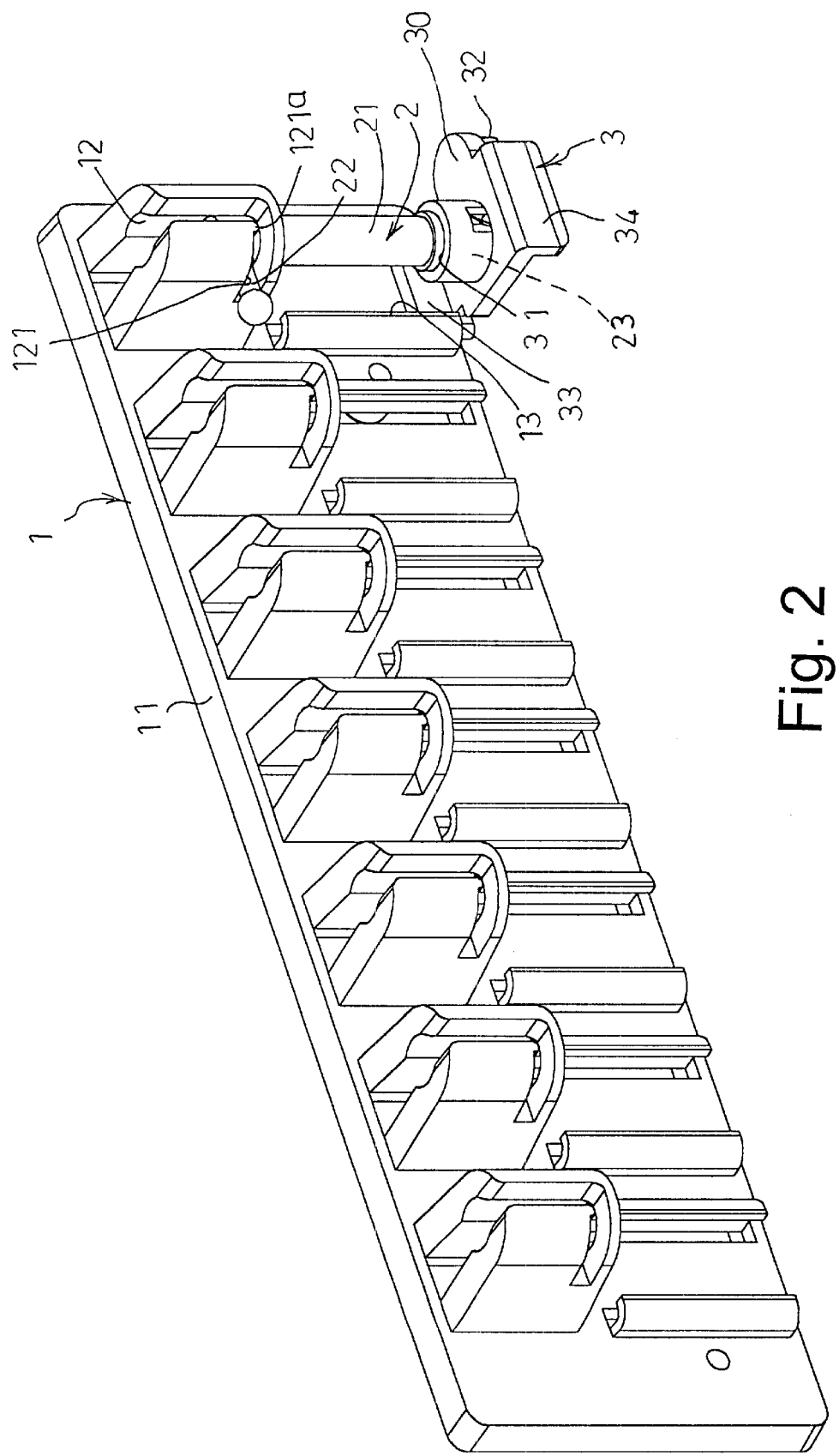
FIG. 2 is a perspective assembled view of the present invention.

Please refer to FIGS. 1 to 5. The present invention includes a base board 1 fixedly mounted on the housing 5 of the computer above the computer interface card socket 51, at least one slide rod 2 slidably disposed on the base board 1, and at least one latch board 3 correspondingly connected with bottom end of the slide rod 2. A locating pin 32 downward projects from the bottom of the latch board 3. The slide rod 2 can be operated to slide toward the interface card socket 51, whereby the locating pin 32 of the latch board 3 can be correspondingly inserted and latched in a fixing hole 41 of an insertion plate 4 and a latch hole 52 of the retaining board of top end of the interface card socket 51. Accordingly, the insertion plate 4 can be tightly fixed on inner side of the interface card socket 51.

The insertion plate 4 is a fixing insertion plate for fixing interface card such as display card, internet card, audio card, etc. or shield plate for shielding the interface card socket 51.

Figure 3:
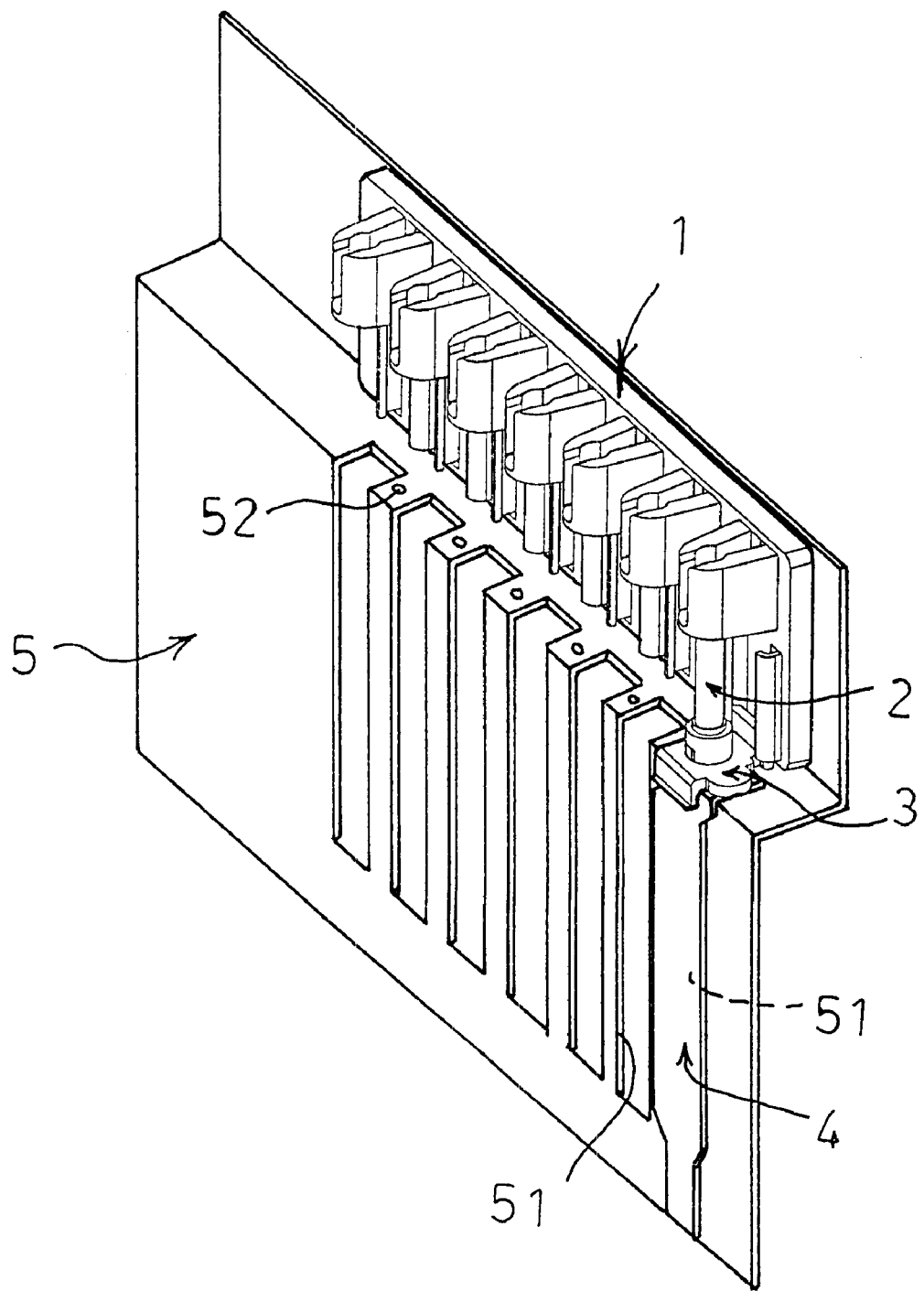
FIG. 3 is a perspective view showing that an insertion plate is latched and fixed on an interface card socket of the present invention.

Referring to FIGS. 1 and 3, the base board 1 includes a board body 11 which can be fixed on the computer housing 5 by screws. The board body 11 is formed with a slide tunnel 12. The edge of the slide tunnel 12 is formed with a transverse locating split 121 having a projecting section 121a. The board body 11 is further formed with at least one guide channel 13 in which a guide board 33 of the latch board 3 is snugly slidably fitted, whereby the guide board 33 can slide along the guide channel 13.

The back of the board body 11 can be alternatively formed with multiple projecting hooks for firmly hooking the computer housing 5.

The slide rod 2 includes a rod body 21 snugly slidably fitted in the slide tunnel 12 of the base board. The edge of the rod body 21 is formed with a projecting handle section 22 for a user to shift the slide rod 2 along the slide tunnel 12. The handle section 22 can be slided into the locating split 121 of the slide tunnel 12 and stopped by the projecting section 12 1a thereof to be stably latched in the locating split 121. At this time, the slide rod 2 is located. The bottom end of the rod body 21 is formed with a latch section 23 which is correspondingly latched in a connecting hole 31 of the latch board 3.

As shown in FIG. 1, the latch board 3 includes a main body 30 formed with a connecting hole 31 for connecting with the bottom end of the slide rod 2. In addition, the bottom of the main body 30 has a locating pin 32 projecting therefrom for correspondingly fitting into the insertion plate 4 and the computer housing 5. The rear edge of the main body 30 is further formed with a guide board 33 slidably fitted in the guide channel 13 of the base board 1. A stop wall 34 downward projects from front end of the main body 30 for abutting against the outer edge of the latched insertion plate 4 so as to prevent the insertion plate 4 from being inward deflected when inserting the interface card.

Figure 4:
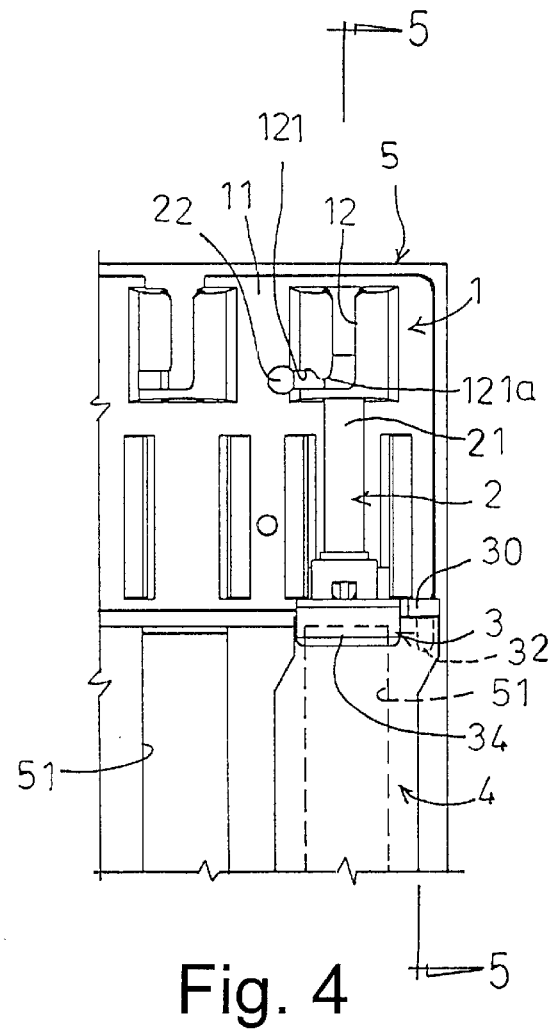
FIG. 4 is a plane view of the present invention.
Figure 5:
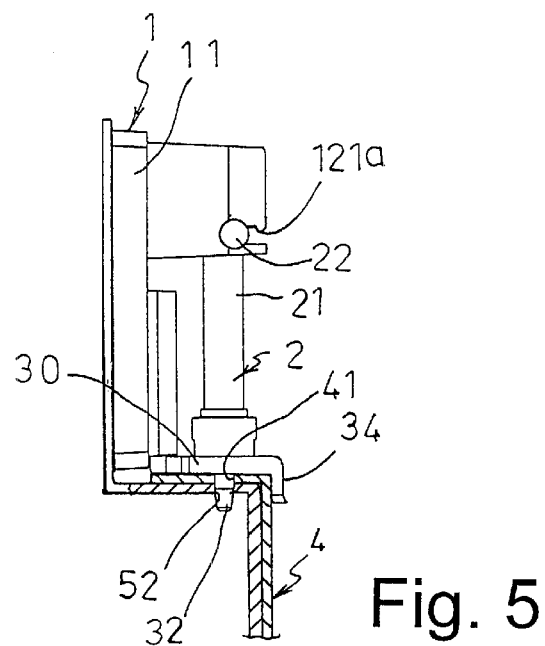
FIG. 5 is a partially sectional view taken along line 5—5 of FIG. 4.

As shown in FIGS. 3, 4 and 5, when latching an insertion plate 4 on an interface card socket 51, the slide rod 2 is slided toward the interface card socket 51, whereby the locating pin 32 of the latch board 3 connected with the bottom of the slide rod 2 is latched in the fixing hole 41 of the insertion plate 4 and the latch hole 52 of the computer housing 5. Then, the handle 22 of the slide rod 2 is moved into the locating split 121 of the slide tunnel 12 and stopped by the projecting section 12 1a. At this time, the slide rod 2 is firmly located and the latch board 3 stably latches the insertion plate 4 on inner side of the interface card socket 51.

When a user desires to detach the insertion plate 4, the handle 22 of the slide rod 2 is moved out of the locating split 121 and moved along the slide tunnel 12 away from the interface card socket 51. At this time, the latch board 3 is driven and the locating pin 32 thereof is moved out of the insertion plate 4 and the computer housing 5. Accordingly, the insertion plate 4 is unlatched and can be easily detached.

According to the above arrangement, the present invention has the following advantages:

1. When latching or detaching the insertion plate 4, it is no more necessary to use a screwdriver so that the procedure is convenient to a user.
2. The mounting and detachment of the insertion plate can be quickly and easily performed.

The above embodiment is only used to illustrate the present invention, not intended to limit the scope thereof. Many modifications of the above embodiment can be made without departing from the spirit of the present invention.

What is claimed is:

1. Simple screwfree locating structure for computer interface card and shield plate of interface card socket, comprising:
    a base board fixedly mounted on a computer housing corresponding to the computer interface card socket, the base board being formed with at least one slide tunnel;
    at least one slide rod correspondingly slidably disposed in the slide tunnel of the base board; and
    at least one latch board correspondingly connected with bottom end of the slide rod, a locating pin downward projecting from the bottom of the latch board, whereby when the slide rod is slided toward the interface card socket, the locating pin of the latch board is driven and correspondingly inserted and latched in an insertion plate and the computer housing so as to tightly fix the insertion plate on inner side of the interface card socket.

2. Simple screwfree locating structure for computer interface card and shield plate of interface card socket as claimed in claim 1, wherein the base board includes a board body which can be fixed on the computer housing, the board body being formed with at least one slide tunnel, an edge of the slide tunnel being formed with a transverse locating split on which a projecting section is disposed, the board body being further formed with at least one guide channel in which a guide board of the latch board is snugly slidably fitted, whereby the guide board can slide along the guide channel.

3. Simple screwfree locating structure for computer interface card and shield plate of interface card socket as claimed in claim 1, wherein the slide rod includes a rod body snugly slidably fitted in the slide tunnel of the base board, an edge of the rod body being formed with a projecting handle section which can be snugly slided into and latched in a locating split of the slide tunnel to stably locate the slide rod, a bottom end of the rod body being formed with a latch section which is correspondingly latched in a connecting hole of the latch board.

4. Simple screwfree locating structure for computer interface card and shield plate of interface card socket as claimed in claim 1, wherein the latch board includes a main body formed with a connecting hole for connecting with the bottom end of the slide rod, the bottom of the main body having a locating pin projecting therefrom for correspondingly fitting into the insertion plate and the computer housing, a rear edge of the main body being further formed with a guide board slidably fitted in the guide channel of the base board, a stop wall downward projecting from front end of the main body for abutting against the outer edge of the latched insertion plate.

\* \* \* \* \*